United States Patent
Lai et al.

(10) Patent No.: US 10,490,620 B1
(45) Date of Patent: Nov. 26, 2019

(54) ARRAY SUBSTRATE, DISPLAY PANEL AND DISPLAY DEVICE

(71) Applicant: Xiamen Tianma Micro-Electronics Co., Ltd., Xiamen (CN)

(72) Inventors: Guochang Lai, Xiamen (CN); Yihua Zhu, Xiamen (CN); Xuexin Lan, Xiamen (CN); Guozhao Chen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 16/229,287

(22) Filed: Dec. 21, 2018

(30) Foreign Application Priority Data

Jun. 29, 2018 (CN) .......................... 2018 1 0714724

(51) Int. Cl.
| | |
|---|---|
| *H01L 27/32* | (2006.01) |
| *H01L 51/52* | (2006.01) |
| *G02F 1/1362* | (2006.01) |
| *G02F 1/1368* | (2006.01) |
| *G02F 1/1333* | (2006.01) |

(52) U.S. Cl.
CPC ........ *H01L 27/3276* (2013.01); *G02F 1/1368* (2013.01); *G02F 1/133308* (2013.01); *G02F 1/136286* (2013.01); *H01L 51/52* (2013.01)

(58) Field of Classification Search
None
See application file for complete search history.

(56) References Cited

FOREIGN PATENT DOCUMENTS

| CN | 201786340 U | 4/2011 |
|---|---|---|
| CN | 102183860 A | 9/2011 |
| CN | 105867035 A | 8/2016 |
| CN | 206619376 U | 11/2017 |

*Primary Examiner* — Zandra V Smith
*Assistant Examiner* — Lawrence C Tynes, Jr.
(74) *Attorney, Agent, or Firm* — Miller, Matthias & Hull LLP

(57) ABSTRACT

Provided are an array substrate, a display panel and a display device. The array substrate includes a base substrate, and a plurality of first signal lines and a plurality of second signal lines insulated from each other on a side of the base substrate. When some of the plurality of first signal lines extend to the wiring region, the wiring of which is configured to be around the assembly setting area and forms a first signal line concentrated region, and a first signal line passing through the wiring region includes a first signal line body portion and a first signal line winding portion. When some of the plurality of second signal lines extend to the wiring region, the wiring of which is configured to be around the assembly setting area and forms a second signal line concentrated region.

16 Claims, 16 Drawing Sheets

ARRAY SUBSTRATE, DISPLAY PANEL AND DISPLAY DEVICE

CROSS-REFERENCES TO RELATED APPLICATIONS

This application claims priority to Chinese patent application No. 201810714724.0 filed on Jun. 29, 2018, the disclosure of which is incorporated herein by reference in its entirety.

TECHNICAL FIELD

The present disclosure relates to a display technology field, and in particular, relates to an array substrate, a display panel and a display device.

BACKGROUND

With many advantages such as a thin body, power saving and no radiation, a flat panel display device has been widely used. In a related art, the flat panel display device mainly includes a liquid crystal display device, an organic light emitting display device, and the like. In the flat panel display device, a display panel mainly performs a display function.

With the development of technology, users and technicians are increasingly hoping that display panels have a larger screen-to-body ratio. Ideally, a full screen is achieved. A full screen is literally explained as the whole area of the front side of a display device (such as a mobile phone) being covered by the screen. Although it is difficult to achieve a full screen (for example, structures such as a handset, a camera, etc. also need to be placed at the front side) due to the limited technology nowadays, it is possible to increase the screen-to-body ratio as much as possible.

How to increase the screen-to-body ratio of the display panel and the display device has become an urgent problem to be solved.

SUMMARY

The present disclosure provides an array substrate, a display panel and a display device to increase the screen-to-body ratio of the display panel and the display device.

In a first aspect, the present disclosure provides an array substrate including a display area and at least one non-display area surrounded by the display area, and the at least one non-display area includes a wiring region and an assembly setting area.

The array substrate includes a base substrate, and a plurality of first signal lines and a plurality of second signal lines insulated from each other on a side of the base substrate. In the display area, the plurality of first signal lines extend along a first direction and are arranged along a second direction, the plurality of second signal lines extend along the second direction and are arranged along the first direction, and the first direction and the second direction are parallel to the base substrate and intersect with each other.

When some of the plurality of first signal lines extend to the wiring region, wiring of some of the plurality of first signal lines is configured to be around the assembly setting area and forms a first signal line concentrated region. The first signal line passing through the wiring region includes a first signal line body portion located in the display area and a first signal line winding portion located in the wiring region. When some of the plurality of second signal lines extend to the wiring region, wiring of some of the plurality of second signal lines is configured to be around the assembly setting area and forms a second signal line concentrated region. The second signal line passing through the wiring region includes a second signal line body portion located in the display area and a second signal line winding portion located in the wiring region.

The second signal line concentrated region is located between the first signal line concentrated region and the assembly setting area. The second signal line winding portion includes a second signal line straight line portion and a second signal line connecting portion, and the second signal line straight line portion extends along the same direction as the second signal line body portion. The plurality of second signal line connecting portions include a plurality of first winding lines and a plurality of second winding lines, and the first winding line and the second winding line are disposed in different layers.

In a second aspect, the present disclosure provides a display panel including the array substrate described in the first aspect.

In a third aspect, the present disclosure provides a display device including the display panel described in the second aspect.

An embodiment of the present disclosure provides an array substrate. The display area of the array substrate surrounds the non-display area. The array substrate includes multiple first signal lines and multiple second signal lines. The first signal line and the second signal line pass through the non-display area to run wiring around the assembly setting area in the non-display area, thereby forming the first signal line concentrated region and the second signal line concentrated region surrounded by the first signal line concentrated region. The first signal line includes the first signal line body portion located in the display area and the first signal line winding portion located in the non-display area (specifically, the wiring region in the non-display area). The second signal line includes the second signal line body portion located in the display area and the second signal line winding portion located in the non-display area (specifically, the wiring region in the non-display area). Multiple second signal line winding portions include the first winding line and the second winding line which are disposed in different layers. Some of the multiple second signal lines are constituted by the first winding lines, and the other of the multiple second signal lines are constituted by the second winding lines. Since the first winding line and the second winding line are located in different layers, the second signal lines originally disposed in one layer are disposed in two layers in the second signal line concentrated region, which reduces the number of the second signal lines in each layer, thereby reducing the non-display area, so as to increase the screen-to-body ratio of the display panel and the display device.

DETAILED DESCRIPTION

Figure 1:
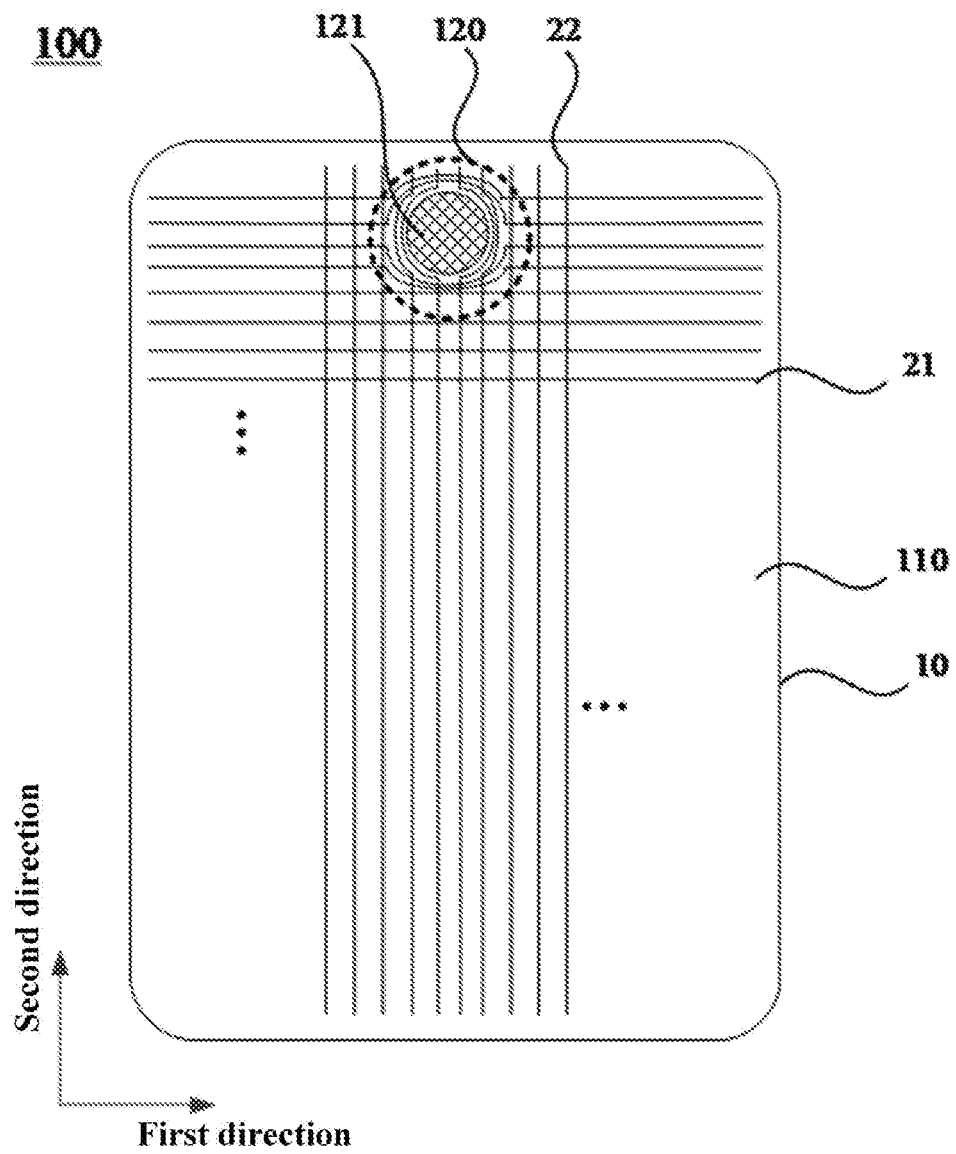
FIG. 1 is a top view showing structures of an array substrate according to an embodiment of the present disclosure.

The present disclosure will be further described in detail in conjunction with the drawings and embodiments. It is to be understood that the embodiments set forth below are intended to illustrate and not to limit the present disclosure. In addition, it should be noted that, in order to facilitate description, merely a part of structures related to the present disclosure rather than the whole structure are illustrated in the drawings.

Figure 2:
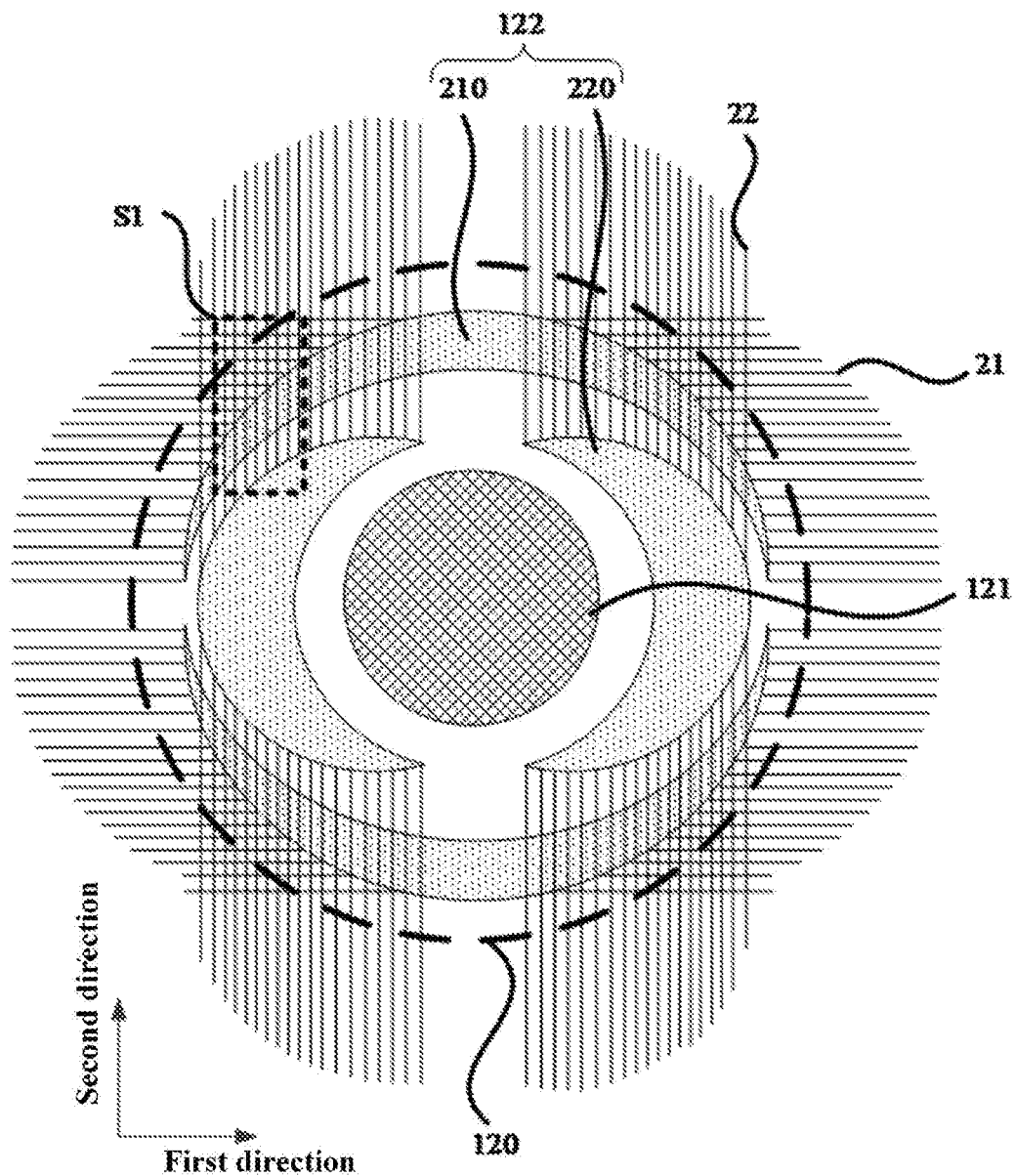
FIG. 2 is a top view showing structures of a non-display area of FIG. 1.
Figure 3:
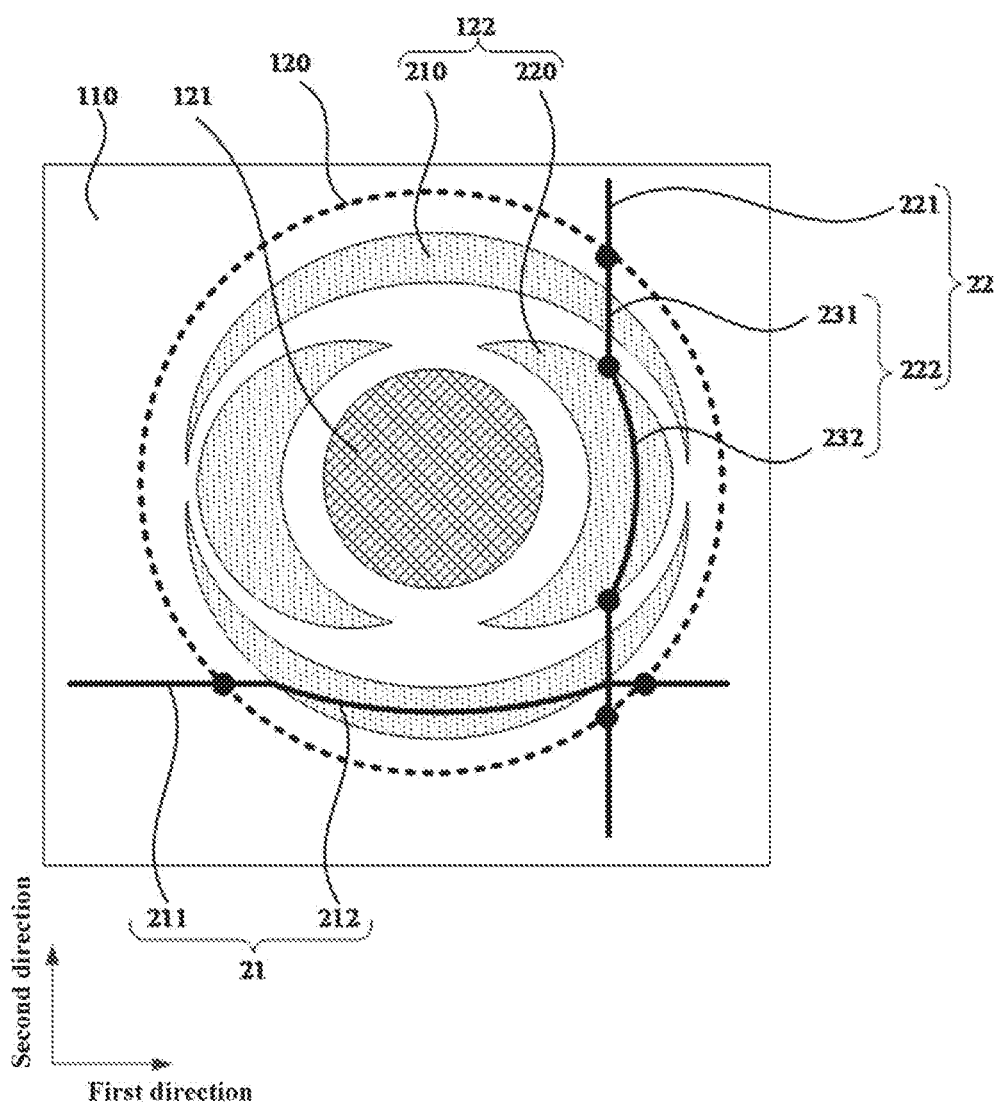
FIG. 3 is a partial view of structures of an array substrate shown in FIG. 1.

FIG. 1 is a top view showing structures of an array substrate according to an embodiment of the present disclosure, FIG. 2 is a top view showing structures of a non-display area of FIG. 1, and FIG. 3 is a partial view of structures of an array substrate of FIG. 1. Referring to FIGS. 1, 2 and 3, an array substrate 100 includes a display area 110 and at least one non-display area 120 (illustrated by taking a non-display area 120 as an example in FIG. 1) surrounded by the display area 110. The non-display area 120 includes a wiring region 122 (the area other than an assembly setting area 121 in the non-display area 120 is the wiring region 122) and an assembly setting area 121, and the wiring region 122 may be used for configuring metal wires, such as scanning lines, data lines, touch electrode lines, etc. The array substrate 100 includes a base substrate 10 and a plurality of first signal lines 21 and a plurality of second signal lines 22 insulated from each other on one side of the base substrate 10. In the display area 110, the plurality of first signal lines 21 extend along the first direction and are arranged along the second direction, the plurality of second signal lines 22 extend along the second direction and are arranged along the first direction, and the first direction and the second direction are parallel to the base substrate 10 and intersect with each other.

When some of the plurality of first signal lines 21 extend to the wiring region 122, wiring of the some of the plurality of first signal lines 21 is configured to be around the assembly setting area 121 and forms a first signal line concentrated region 210, and the first signal line 21 passing through the non-display area 120, the wiring of which in the wiring region 122 is in a similar shape to the contour of the assembly setting area 121 so as to bypass the assembly setting area 121. When the contour of the assembly setting area 121 is circular or elliptical, a first signal line 21 passing through the non-display area 120 forms a semi-closed ring around the assembly setting area 121, and a plurality of first signal lines 21 passing through the non-display area 120 form a crescent shape around the assembly setting area 121. A first signal line 21 passing through the wiring region 122 includes a first signal line body portion 211 located in the display area 110 and a first signal line winding portion 212 located in the wiring region 122. It should be noted that, in order to make each portion of the first signal line 21 and the second signal line 22 clearer, multiple "black dots" are provided in FIG. 3. The "black dots" in FIG. 3 are merely provided for a clear illustration and not actual structures of the array substrate 100. In FIGS. 2 and 3, a large number of concentrated first signal lines 21 are disposed in the first signal line concentrated region 210 in which the distance between two adjacent first signal lines 21 is smaller than that in the display area 110, and a large number of concentrated second signal lines 22 are disposed in the second signal line concentrated region 220 in which the distance between two adjacent second signal lines 22 is smaller than that in the display area 110. Similarly, for a clear illustration, the first signal line 21 disposed in the first signal line concentrated region 210 and the second signal line 22 disposed in the second signal line concentrated region 220 are omitted from illustration. When some of the plurality of second signal lines 22 extend to the wiring region 122, wiring of the plurality of second signal lines 22 is configured to be around the assembly setting area 121 and forms a second signal line concentrated region 220, and the second signal line 22 passing through the non-display area 120, the wiring of which in the wiring region 122 is in the similar shape of the contour of the assembly setting area 121 so as to bypass the assembly setting area 121. When the contour of the assembly setting area 121 is circular or elliptical, a second signal line 22 passing through the non-display area 120 forms a semi-closed ring around the assembly setting area 121, and a plurality of second signal lines 22 passing through the non-display area 120 form a crescent shape around the assembly setting area 121. A second signal line 22 passing through the wiring region 122 includes a second signal line body portion 221 located in the display area 110 and a second signal line winding portion 222 located in the wiring region 122.

The second signal line concentrated region 220 is located between the first signal line concentrated region 210 and the assembly setting area 121, the second signal line concentrated region 220 is located at the periphery of the assembly setting area 121, the first signal line concentrated region 210 is located at the periphery of the second signal line concentrated region 220, and the display area 110 is located at the periphery of the first signal line concentrated region 210. The second signal line winding portion 222 includes a second signal line straight line portion 231 and a second signal line connecting portion 232, and the second signal line straight line portion 231 and the second signal line body portion 221 extend along the same direction, i.e. the second direction, and disposed in a same layer.

Figure 4:
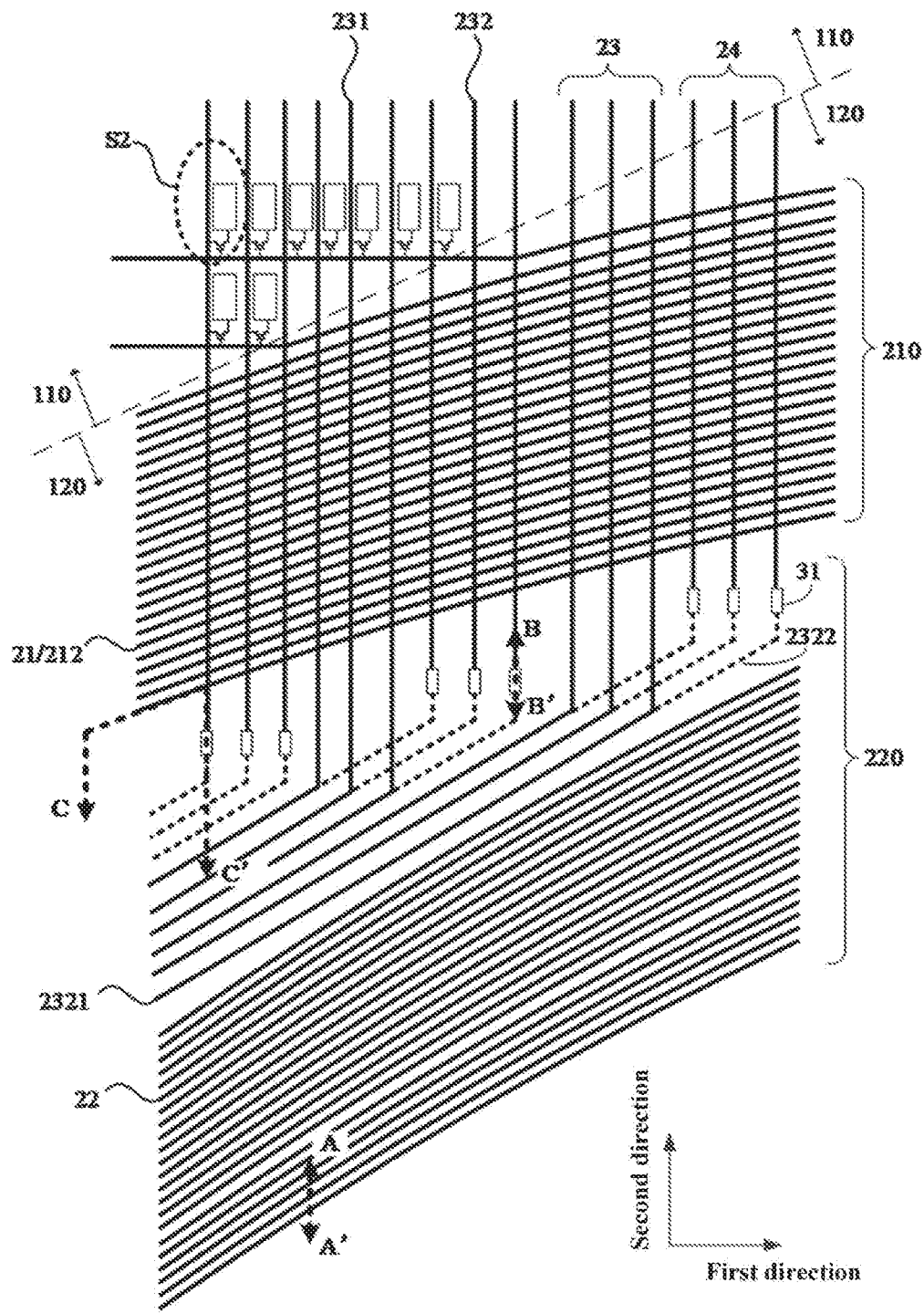
FIG. 4 is an enlarged view of structures of an area S1 in FIG. 2.
Figure 5:
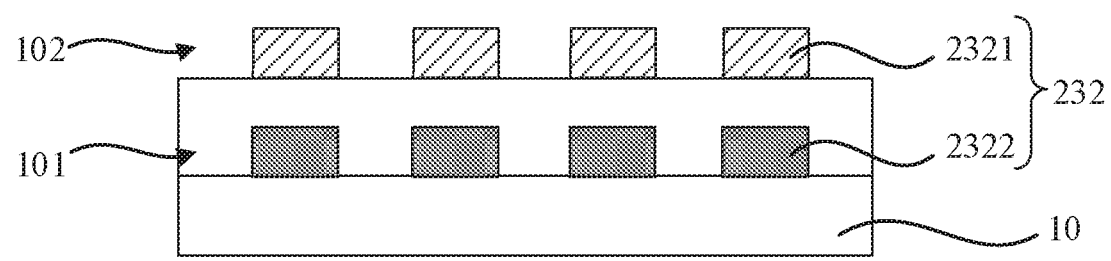
FIG. 5 is a sectional view of structures of FIG. 4 taken along A-A' direction.
Figure 6:
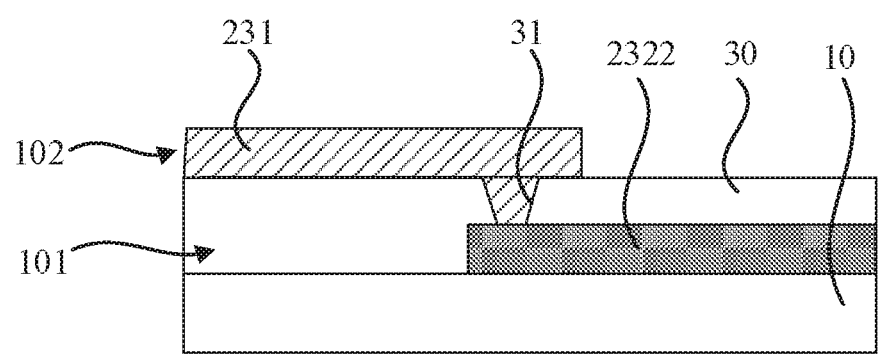
FIG. 6 is a sectional view of structures of FIG. 4 taken along B-B' direction.
Figure 7:
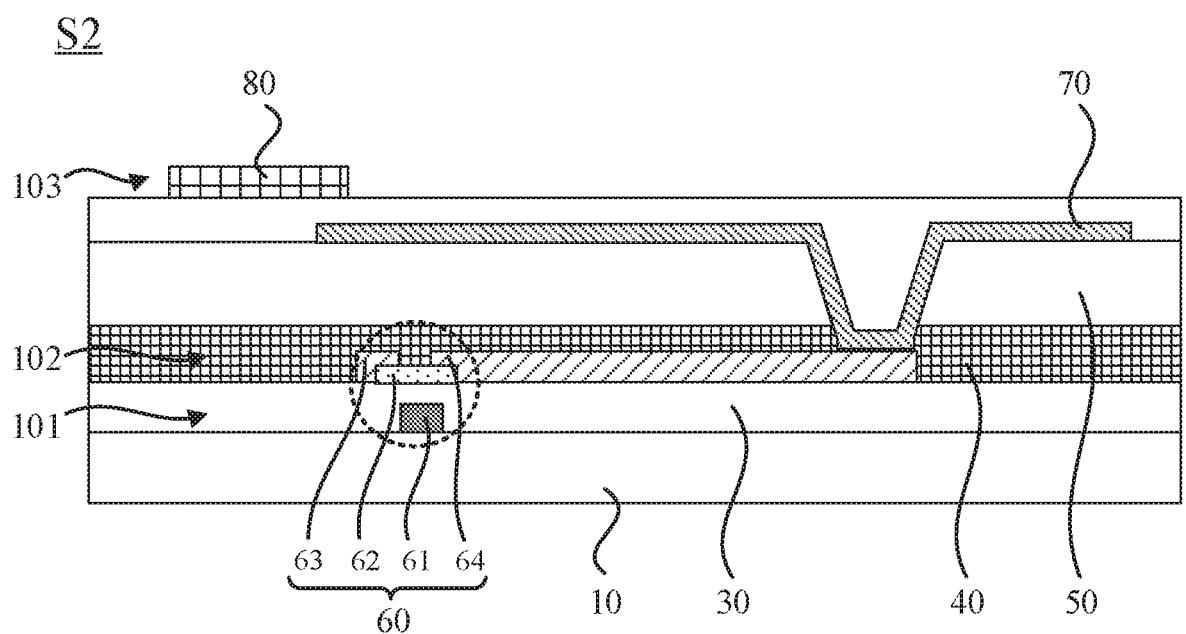
FIG. 7 is a sectional view of structures of an area S2 in FIG. 4.

FIG. 4 is an enlarged view of structures of an area S1 in FIG. 2, FIG. 5 is a sectional view of structures of FIG. 4 taken along the A-A' direction, FIG. 6 is a sectional view of structures of FIG. 4 taken along the B-B' direction, and FIG. 7 is a sectional view of structures of an area S2 in FIG. 4. Referring to FIGS. 1-7, the first signal line concentrated region 210 and the second signal line concentrated region 220 are located in the non-display area 120, and the second signal line concentrated region 220 is located on the side of the first signal line concentrated region 210 facing away from the display area 110. The display area 110 is provided with multiple sub-pixels and each sub-pixel is electrically connected to a first signal line 21 and a second signal line 22. The array substrate 100 may include a first metal layer 101, a gate electrode insulating layer 30, a second metal layer 102, a passivation layer 40, and a planarization layer 50, which are sequentially stacked. The first metal layer 101 is disposed between the second metal layer 102 and the base substrate 10. The array substrate 100 may further include a thin film transistor 60 and a pixel electrode 70. The thin film transistor 60 includes a gate electrode 61, a semiconductor layer 62, a source electrode 63, and a drain electrode 64. The pixel electrode 70 is electrically connected to the drain electrode 64 of the thin film transistor 60 via through holes of the passivation layer 40 and the planarization layer 50. The gate electrode 61 may be disposed in the first metal layer 101, and the source electrode 63 and the drain electrode 64 may be disposed in the second metal layer 102. The passivation layer 40 may be made of a silicon nitride or a silicon oxide material, and the planarization layer 50 is typically made of an organic material. The array substrate 100 may further include a touch electrode 80 for achieving the touch position detection. The touch electrode 80 may be disposed in the third metal layer 103 and on a side of the pixel electrode 70 facing away from the base substrate 10. A plurality of second signal line connecting portions 232 include a plurality of first winding lines 2321 and a plurality of second winding lines 2322. That is, two types of the second signal lines 22 are provided, each type of the second signal line 22 merely includes the first winding line 2321 or the second winding line 2322. The first winding line 2321 and the second winding line 2322 are disposed in different layers. It should be noted that, in FIG. 4, the spacing between some of the second signal lines 22 and the second signal lines 22 adjacent thereto in the second signal line concentrated region 220 is enlarged for a clear illustration.

The present disclosure provides an array substrate where a display area of the array substrate surrounds a non-display area. The array substrate includes a plurality of first signal lines and a plurality of second signal lines. The wiring of the first signal lines and the second signal lines is configured to be around an assembly setting area in the non-display area when the first signal lines and the second signal lines pass through the non-display area, thereby forming a first signal line concentrated region and a second signal line concentrated region, and the first signal line concentrated region surrounds the second signal line concentrated region. The first signal line includes a first signal line body portion located in the display area and a first signal line winding portion located in the non-display area (specifically, a wiring region in the non-display area). The second signal line includes a second signal line body portion located in the display area and a second signal line winding portion located in the non-display area (specifically, the wiring region in the non-display area). A plurality of second signal line winding portions include first winding lines and a second winding lines disposed in different layers. Some of the plurality of second signal lines are constituted by the first winding lines, and the other of the multiple second signal lines are constituted by the second winding lines. Since the first winding lines and the second winding lines are located in different layers, the second signal lines originally disposed in one layer are disposed in two layers in the second signal line concentrated region, which reduces the number of the second signal lines in each layer, thereby reducing the non-display area, so as to increase the screen-to-body ratio of a display panel and a display device.

In one embodiment, referring to FIGS. 4 and 5, in the second signal line concentrated region 220, an orthographic projection of a first winding line 2321 on the base substrate 10 is overlapped with an orthographic projection of a second winding line 2322 on the base substrate 10. To further reduce the space of the non-display area 120, the orthographic projection of a first winding line 2321 may coincide with that of a second winding line 2322 on the base substrate 10.

In one embodiment, referring to FIGS. 4 and 5, the number of the first winding lines 2321 is equal to that of the second winding lines 2322. Therefore, when the orthographic projection of a first winding line 2321 coincides with that of a second winding line 2322 on the base substrate 10, a first winding line 2321 and a second winding line 2322 occupy only half of the space when disposed in the same layer, and then all the first winding lines 2321 and all the second winding lines 2322 occupy only half of the space when disposed in the same layer, thereby reducing the space of the non-display area 120.

In one embodiment, referring to FIGS. 1-7, the first signal line body portion 211 is disposed in the first metal layer 101, the second signal line body portion 221 is disposed in the second metal layer 102, the first signal line 21 is a scanning line, and the second signal line 22 is a data line. The first signal line body portion 211 may be located in the same layer as the gate electrode 61 of the thin film transistor 60, and the second signal line body portion 221 may be located in the same layer as the source electrode 63 and the drain electrode 64 of the thin film transistor 60. In the wiring region 122, a concentrated region formed by the scanning lines is located at the periphery of a concentrated region formed by the data lines, and the data lines in the concentrated region may be stacked. In other embodiments, the first signal line body portion 211 may be disposed in the second metal layer 102, the second signal line body portion 221 is disposed in the first metal layer 101, the first signal line 21 is a data line, and the second signal line 22 is a scanning line. In the wiring region 122, a concentrated region formed by the data lines is located at the periphery of a concentrated region formed by the scanning lines, and the scanning lines in the concentrated region may be stacked. The positional relationship between the concentrated region formed by the data lines and the concentrated region formed by the scanning lines may be determined according to specific product requirements, and is not limited by the present disclosure. For simplicity, in each embodiment of the present disclosure, the first signal line 21 is the scanning line and the second signal line 22 is the data line, which is taken as an example for explanation.

In one embodiment, referring to FIGS. 3, 4, 6 and 7, the array substrate 100 further includes a gate electrode insulating layer 30, the gate electrode insulating layer 30 located between the plurality of first signal line body portions 211 and the plurality of second signal line body portions 221. The first winding line 2321 and the second signal line body portion 221 are located in the same layer, and the second winding line 2322 and the second signal line straight line portion 231 are disposed in different layers and electrically connected through the via hole 31 disposed in the gate electrode insulating layer 30.

Figure 8:
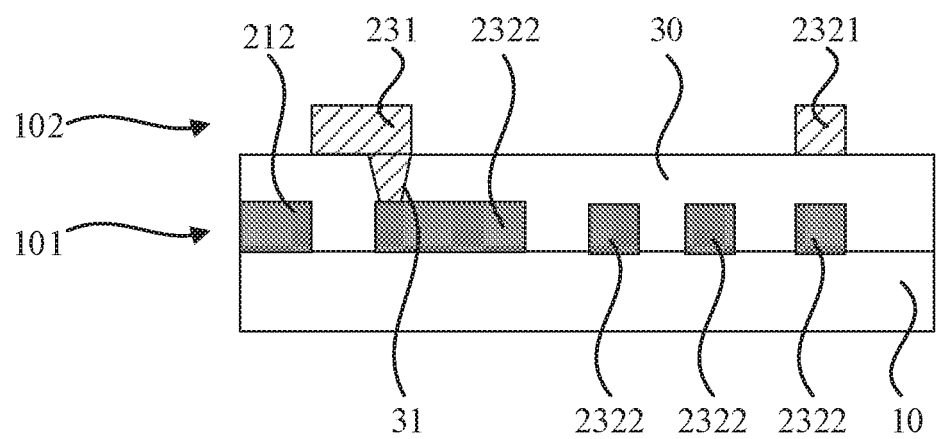
FIG. 8 is a sectional view of structures of FIG. 4 taken along C-C' direction.

FIG. 8 is a sectional view of structures of FIG. 4 taken along the C-C' direction. Referring to FIGS. 3, 4, 7 and 8, the first signal line winding portion 212 is located in the same layer as the first signal line body portion 211, and the first signal line winding portion 212 is disposed in the first metal layer 101. The first winding line 2321 is located in the same layer as the second signal line body portion 221, and the first winding line 2321 is disposed in the second metal layer 102. The second winding line 2322 is located in the same layer as the first signal line body portion 211, and second winding line 2322 is disposed in the first metal layer 101. The second signal line straight line portion 231 is located in the same layer as the second signal line body portion 221, and the second signal line straight line portion 231 and the second winding line 2322 are electrically connected via the via hole 31 of the gate electrode insulating layer 30. In an embodiment of the present disclosure, the first winding line 2321 is located in the same layer as the second signal line body portion 221 and the second signal line straight line portion 231, so that the first winding line 2321 and the second signal line straight line portion 231 may be electrically connected without passing through the via hole. The second winding line 2322 is located in the same layer as the first signal line body portion 211 which is disposed in the first metal layer 101 together with the first signal line winding portion 212 and the second winding line 2322, and the second signal line body portion 221, the second signal line connecting portion 231, and the first winding line 2321 are disposed in the second metal layer 102. That is, all of the first signal lines 21 and the second signal lines 22 may be made of the metal of the first metal layer 101 and the second metal layer 102 without adding a new metal layer. Therefore, the process of fabricating the first signal line 21 and the second signal line 22 is simplified.

Figure 9:
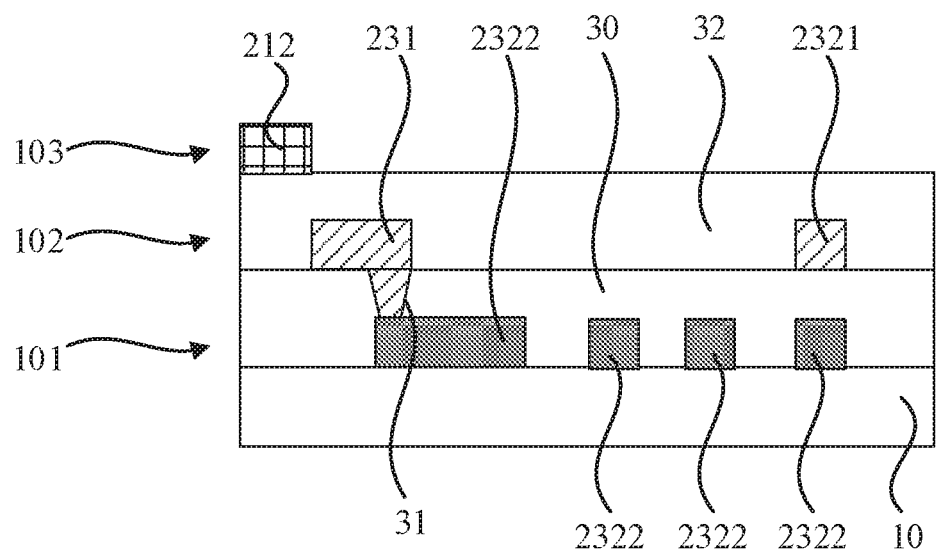
FIG. 9 is another sectional view of structures of FIG. 4 taken along the C-C' direction.

FIG. 9 is another sectional view of structures of FIG. 4 taken along the C-C' direction. Referring to FIGS. 3, 4, 7 and 9, the array substrate 100 further includes a third metal layer 103, and the second metal layer 102 is disposed between the first metal layer 101 and the third metal layer 103. The first signal line winding portion 212 is disposed in the third metal layer 103, the first winding line 2321 is located in the same layer as the second signal line body portion 221, the second signal line straight line portion 231 is located in the same layer as the second signal line body portion 221, and the first winding line 2321 is disposed in the second metal layer 102. The second winding line 2322 is located in the same layer as the first signal line body portion 211, and the second winding line 2322 is disposed in the first metal layer 101. The second signal line straight line portion 231 is electrically connected to the second winding line 2322 via the through hole 31 of the gate electrode insulating layer 30. A first insulating layer 32 is disposed between the second metal layer 102 and the third metal layer 103, where the first insulating layer 32 may be constituted by the passivation layer 40, the planarization layer 50, and an insulating layer between the pixel electrode 70 and the touch electrode 80 shown in FIG. 7. The first signal line body portion 211 and the second winding line 2322 are disposed in the first metal layer 101. The second signal line body portion 221, the second signal line straight line portion 231, and the first winding line 2321 are disposed in the second metal layer 102. The first signal line winding portion 212 is disposed in the third metal layer 103. In the present disclosure, the first winding line 2321 is located in the same layer as the second signal line body portion 221 and the second signal line straight line portion 231, so the first winding line 2321 and the second signal line straight line portion 231 may be electrically connected without passing through the via hole. The first signal line 21 is made of the metal of the first metal layer 101 and the third metal layer 103. The second signal line 22 is made of the metal of the first metal layer 101 and the second metal layer 102. The third metal layer 103 is added for wiring on the basis of the first metal layer 101 and the second metal layer 102, thereby reducing the wiring difficulty of the first signal line 21 and the second signal line 22.

Figure 10:
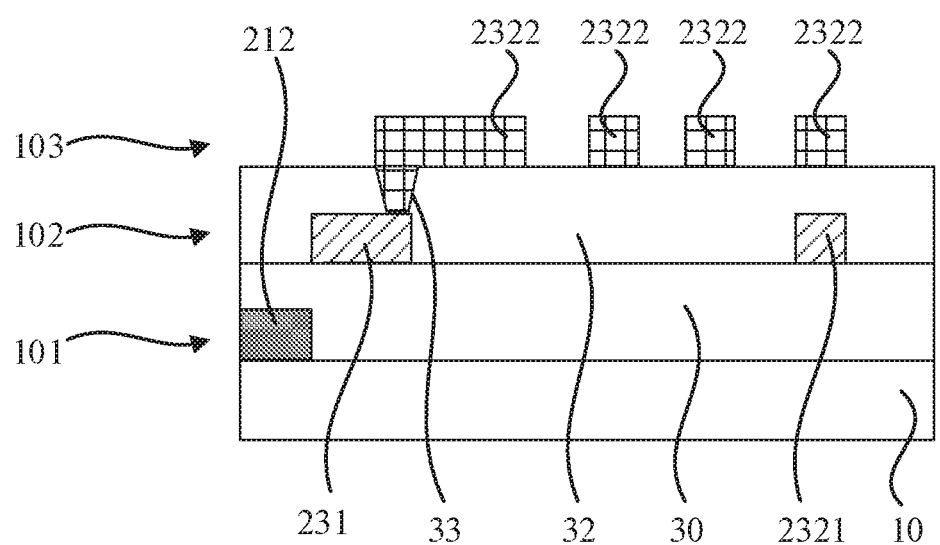
FIG. 10 is another sectional view of a structures of FIG. 4 taken along the C-C' direction.

FIG. 10 is another sectional view of structures of FIG. 4 taken along the C-C' direction. Referring to FIGS. 3, 4, 7 and 10, the array substrate 100 further includes a third metal layer 103, and the second metal layer 102 is disposed between the first metal layer 101 and the third metal layer 103. The first signal line winding portion 212, is located in the same layer as the first signal line body portion 211, and the first signal line winding portion 212 is disposed in the first metal layer 101. The first winding line 2321 is located in the same layer as the second signal line body portion 221, and the first winding line 2321 is disposed in the second metal layer 102. The second winding line 2322 is disposed in the third metal layer 103. A first insulating layer 32 is disposed between the second metal layer 102 and the third metal layer 103, where the first insulating layer 32 may be constituted by the passivation layer 40, the planarization layer 50, and an insulating layer between the pixel electrode 70 and the touch electrode 80 shown in FIG. 7. The second signal line straight line portion 231 is located in the same layer as the second signal line body portion 221. The second winding line 2322 and the second signal line straight line portion 231 are located in different layers and electrically connected through a first via hole 33 disposed in the first gate electrode insulating layer 32. The first signal line body portion 211 and the first signal line winding portion 212 are disposed in the first metal layer 101. The second signal line body portion 221, the second signal line straight line portion 231, and the first winding line 2321 are disposed in the second metal layer 102. The second winding line 2322 is disposed in the third metal layer 212. In the present disclosure, the first winding line 2321 is located in the same layer as the second signal line body portion 221 and the second signal line straight line portion 231, so that the first winding line 2321 and the second signal line straight line portion 231 may be electrically connected without passing through the via hole. The first signal line 21 is made of the metal of the first metal layer 101. The first signal line body portion 211 and the first signal line winding portion 212 may be electrically connected without passing through a via hole. The second signal line 22 is made of the metal of the second metal layer 102 and the third metal layer 103. The third metal layer 103 is added for wiring on the basis of the first metal layer 101 and the second metal layer 102, thereby reducing the wiring difficulty of the first signal line 21 and the second signal line 22.

Figure 11:
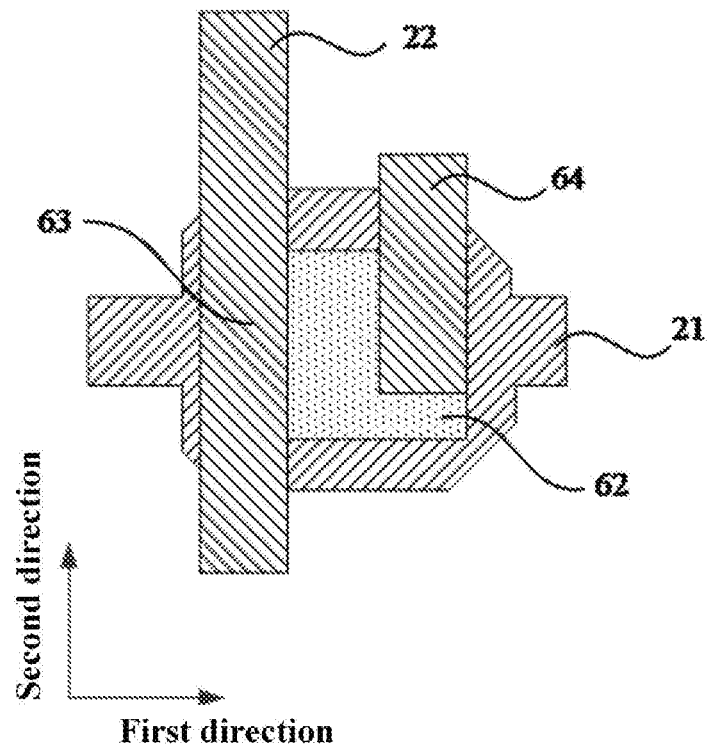
FIG. 11 is a top view of structures of the area S2 in FIG. 4.

FIG. 11 is a top view of structures of the area S2 in FIG. 4. Referring to FIGS. 4, 7 and 11, structures such as the pixel electrode 70 are omitted in FIG. 11. In the display area 110, at the overlapped area of the first signal line 21 and the second signal line 22, in order to provide a driving signal for the pixel structure, a semiconductor layer 62 is further provided between the first signal line 21 and the second signal line 22, a drain electrode 64 is further provided in the same layer where the second signal line 22 is located, and the width of the first signal line 21 at the overlapped area of the first signal line 21 and the second signal line 22 is larger than that at an area where the first signal line 21 is not overlapped with the second signal line 22. In the non-display area 120, due to absence of the semiconductor layer 62 and the drain electrode 64, the width of the first signal line 21 at the overlapped area of the first signal line 21 and the second signal line 22 is equal to that at an area where the first signal line 21 is not overlapped with the second signal line 22.

Figure 12:
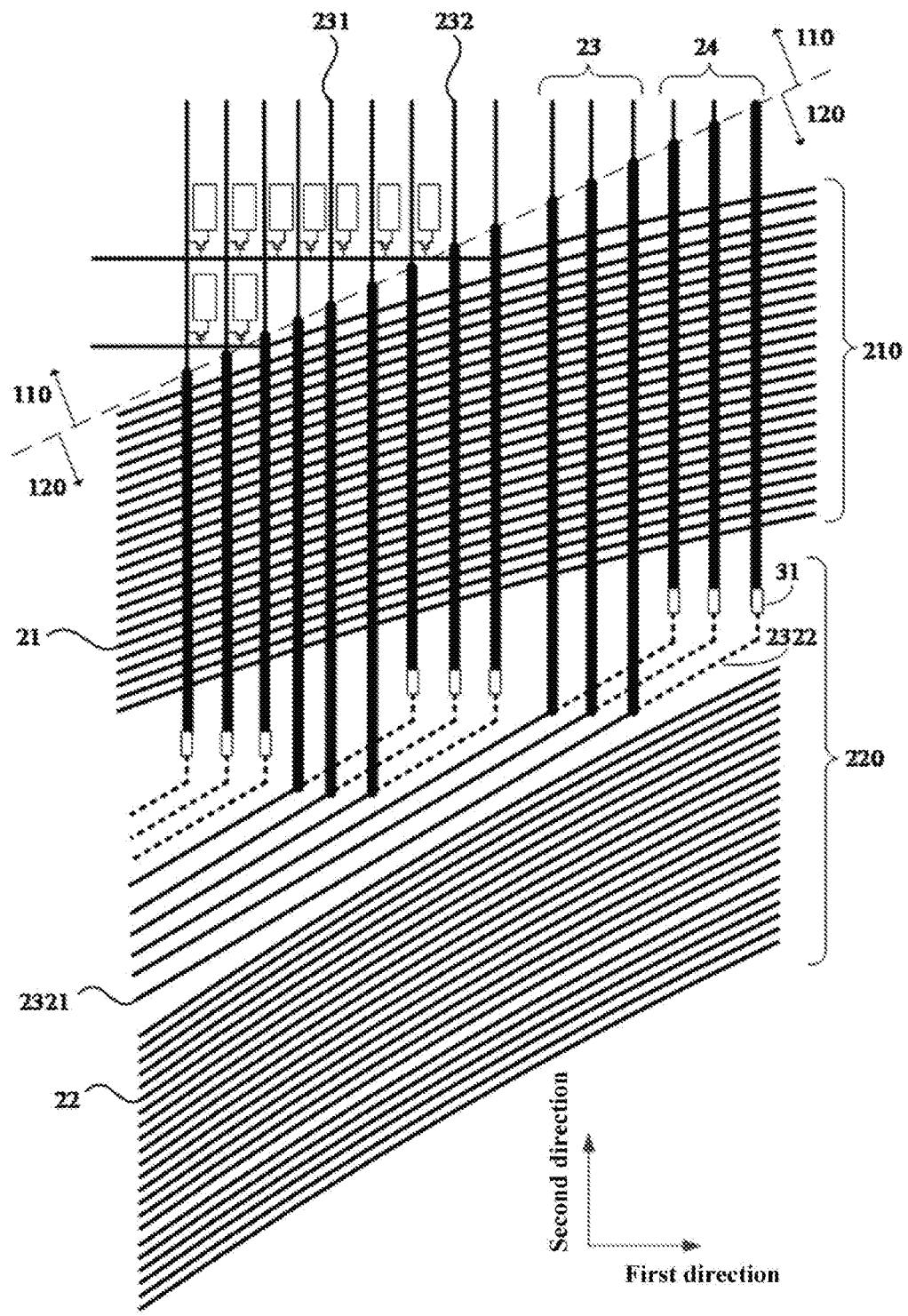
FIG. 12 is an enlarged view of structures of the area S1 in FIG. 2.

Therefore, the overlap space of the first signal line 21 and the second signal line 22 in the display area 110 is greater than that in the non-display area 120, and the overlap capacitance formed in the display area 110 by the first signal line 21 and the second signal line 22 is larger than that formed in the non-display area 120, thereby causing a phenomenon of uneven display. FIG. 12 is an enlarged view of structures of the area S1 in FIG. 2. Referring to FIGS. 2, 3 and 12, the line width of the second signal line straight line portion 231 is larger than that of the second signal line body portion 221 in a same second signal line 22, such that the overlap capacitance formed in the non-display area 120 is appropriately increased. Therefore, the capacitance loads of all the first signal lines 21 and all the second signal lines 22 are as balanced as possible. That is, the load capacitance of the first signal line 21 passing through the non-display area 120 is made coincident with that not passing through the non-display area 120, and the load capacitance of the second signal line 22 passing through the non-display area 120 is made coincident with that not passing through the non-display area 120, thereby eliminating display unevenness.

In one embodiment, referring to FIGS. 1-7, the number of second signal line winding portions 222 is larger than the number of first signal line winding portions 212. The first signal line concentrated region 210 is disposed around the second signal line concentrated region 220. A portion, located in the first signal line concentrated region 210, of the first signal line 21 is disposed in a single layer, and a portion, located in the second signal line concentrated region 220, of the second signal line 22 is stacked since the number of second signal line winding portions 222 is larger than the number of first signal line winding portions 212. That is, the non-display area 120 is provided with more second signal lines 22 and fewer first signal lines 21, and more space of the non-display area 120 may be saved when the second signal lines 22 with a larger number are stacked.

In one embodiment, referring to FIGS. 1-7, the number of second signal line winding portions 222 is 2-4 times that of first signal line winding portions 212. In general, one pixel unit may be provided with 2-4 sub-pixels. Therefore the number of the second signal line winding portions 222 may be 2-4 times the number of first signal line winding portions 212, so that the first signal line 21 and the second signal line 22 that pass through the non-display area 120 can be disposed in an adapted manner of the sub-pixels.

Figure 13:
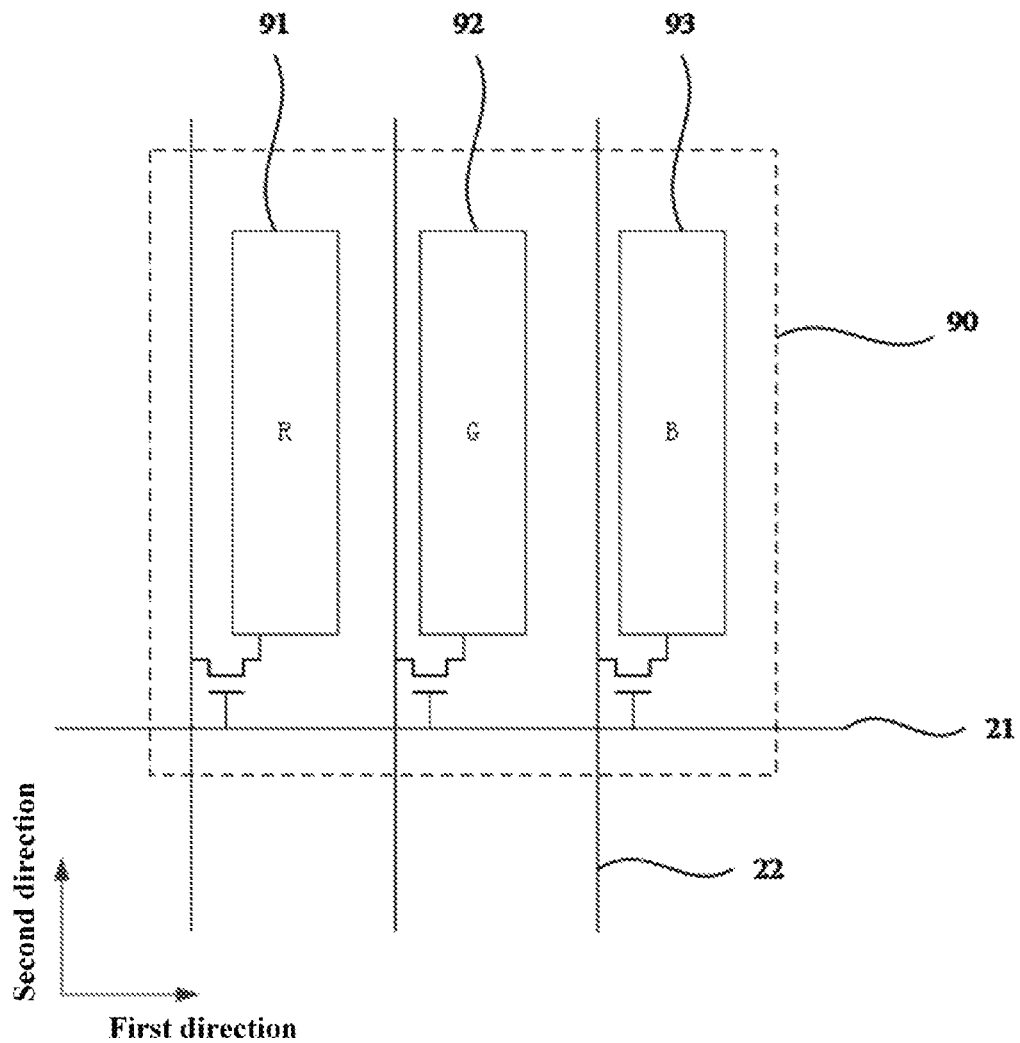
FIG. 13 is a structural diagram of a pixel according to an embodiment of the present disclosure.

Exemplarily, FIG. 13 is a structural view of a pixel according to an embodiment of the present disclosure. Referring to FIGS. 4 and 13, one pixel unit 90 may include three sub-pixels which are respectively a first sub-pixel 91, a second sub-pixel 92, and a third sub-pixel. The first sub-pixel 91 may emit red light, the second sub-pixel 92 may emit green light, and the third sub-pixel 93 may emit blue light. Each of the sub-pixels is electrically connected to a first signal line 21 and a second signal line 22, and all of the sub-pixels in a same pixel unit 90 are arranged in a row along the first direction. It should be understood that, in other embodiments, one pixel unit 90 may further include two or four sub-pixels, which is not limited in the present disclosure.

In one embodiment, referring to FIGS. 3 and 4, the second signal line 22 including the first winding line 2321 is a first sub-signal line 231, and the second signal line 22 including the second winding line 2322 is a second sub-signal line 232. The second signal line 22 passing through the non-display area 120 is divided into two types, which are a first sub-signal line 231 and a second sub-signal line 232, and the first sub-signal line 231 and the second sub-signal line 232 are overlapped in different layers in the second signal line concentrated region 220, thereby saving the space of the non-display area 120. In the wiring region 122, N adjacent second signal lines 22 constitute one signal line group in which all the second signal lines 22 are all the first sub-signal lines 231 or all the second sub-signal lines 232. Two adjacent signal line groups include the first sub-signal lines 231 and the second sub-signal lines 232, and N is a positive integer greater than one. Exemplarily, the signal line group constituted by three adjacent first sub-signal lines 231 is a first sub-signal line group 23, and the signal line group constituted by three adjacent second sub-signal lines 232 is a second sub-signal line group 24. The first sub-signal line group 23 and the second sub-signal line group 24 are alternately arranged along the first direction. A first sub-signal line group 23 and a second sub-signal line group 24 adjacent thereto may be overlapped in different layers in the second signal line concentrated region 220. Since the number of the first sub-signal line 231 included in the first sub-signal line group 23 is equal to that of the second sub-signal line 232 included in the second sub-signal line group 24, all of the first sub-signal lines 231 and all of the second sub-signal lines 232 occupy only half of the space when disposed in the same layer, thereby reducing the space of the non-display area 120.

Optionally, referring to FIGS. 1-3, the contour of the assembly setting area 121 is in the shape of a circle or an ellipse. On one hand, the circle and the ellipse are in regular shapes, and the wiring around the regular shapes is relatively easy with respect to around the irregular shape, on the other hand, the circle and the ellipse are composed of a rounded curve without sharp corners, thus no drastic change exists in the extending direction when wiring is disposed, and it is not easy to cause a disconnection. In other embodiments, the contour of the assembly setting area 121 may be in other shapes such as a rectangle, which are not limited in the present disclosure.

Figure 14:
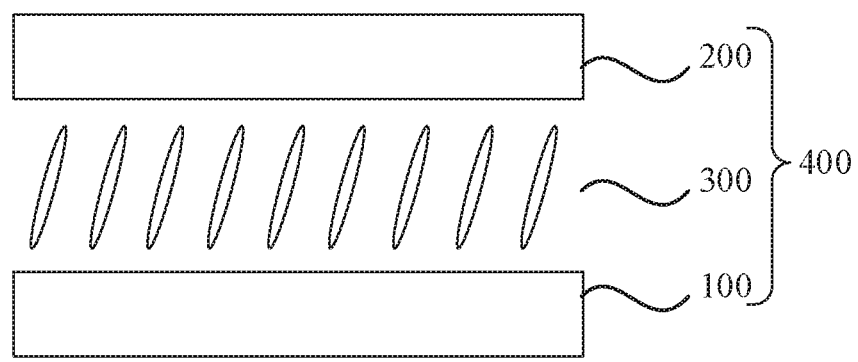
FIG. 14 is a sectional view showing structures of a display panel according to an embodiment of the present disclosure.

FIG. 14 is a sectional view of structures of a display panel according to an embodiment of the present disclosure. Referring to FIG. 14, the display panel 400 includes the array substrate 100 in any of the above embodiments, and a counter substrate 200 opposite to the array substrate 100. The display panel 400 may be a liquid crystal display panel, and the counter substrate 200 may be a color film substrate. The display panel 400 may further include a liquid crystal layer 300 located between the array substrate 100 and the counter substrate 200, the liquid crystal layer 300 includes multiple liquid crystal molecules which are deflected under an electric field so as to control the luminance of the light emitted from a backlight source electrode (not shown) through the liquid crystal display panel 400. Since the display panel 400 includes the array substrate 100 in any of the above embodiments, the display panel 400 has the related advantages of the above-mentioned array substrate. For the implementation of the display panel, the embodiments of the array substrate described above may be referred to, and details are not described herein again.

Figure 15:
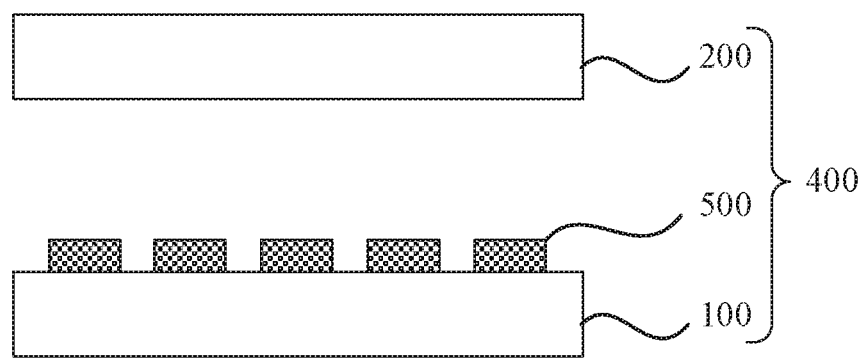
FIG. 15 is another sectional view showing structures of a display panel according to an embodiment of the present disclosure.

FIG. 15 is another sectional view of structures of a display panel according to an embodiment of the present disclosure. Referring to FIG. 15, the display panel 400 includes the array substrate 100 in any of the above embodiments, and a counter substrate 200 opposite to the array substrate 100. The display panel 400 may be an organic light emitting display panel, and the counter substrate 200 may be an encapsulation substrate. The display panel 400 may further include multiple organic light emitting structures 500, all of which may be disposed in the array substrate 100 and arranged in an array. The organic light emitting structure 500 may include a cathode, an anode, and an organic light emitting layer located between the cathode and the anode. The organic light emitting layer may include a light emitting material layer and an auxiliary light emitting layer, and the auxiliary light emitting layer that may include at least one of a hole injection layer, a hole transporting layer, an electron blocking layer, a hole blocking layer, an electron transporting layer, and an electron injection layer. Under the action of an applied electric field, electrons and holes are injected from the cathode and the anode into the light emitting material layer of the organic light emitting layer, respectively, thereby undergoing migration, recombination, and attenuation in the light emitting material layer to emit light. The display panel 400 includes the array substrate 100 in any of the above embodiments, and thus has the related advantages of the above-mentioned array substrate. For the implementation of the display panel, the embodiments of the array substrate described above may be referred to, and details are not described herein again.

Figure 16:
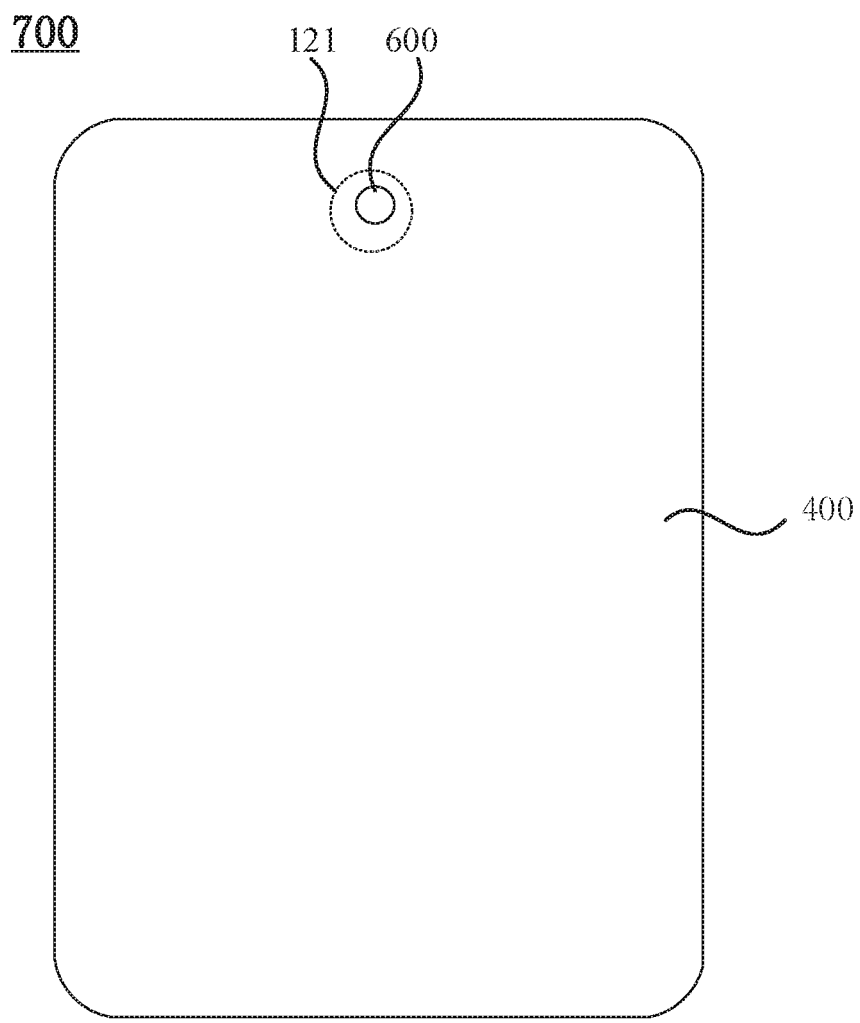
FIG. 16 is a top view showing structures of a display device according to an embodiment of the present disclosure.

The present disclosure further provides a display device, and FIG. 16 is a top view of structures of a display device according to an embodiment of the present disclosure. As shown in FIG. 16, a display device 700 according to the embodiment of the present disclosure includes the display panel 400 described in any of the above embodiments and may be a mobile phone shown in FIG. 16 or a computer, a television, a smart wearable device, etc. which is not specifically limited in the embodiment. Since the display device 700 includes the display panel 400 in any of the above embodiments, the display device 700 has the related advantages of the above-mentioned display panel. For the implementation of the display device, the embodiments of the display panel described above may be referred to, and details are not described herein again. The display device 700 further includes at least one function assembly 600 the orthographic projection of which on the base substrate 10 is located in the assembly setting area 121. The assembly setting area 121 is not provided with the first signal line 21 and the second signal line 22 and thus may be provided with one or more function assemblies 600 that, for example, may be a front-facing camera, a fingerprint recognition device, or a receiver.

It is to be noted that the above are only preferred embodiments of the present disclosure and the technical principles used therein. It will be understood by those skilled in the art that the present disclosure is not limited to the embodiments described herein. Various apparent modifications, readjustment, combinations and substitutions can be made by those skilled in the art without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. An array substrate, comprising a display area and at least one non-display area surrounded by the display area; wherein the at least one non-display area comprises a wiring region and an assembly setting area; wherein the array substrate comprises a base substrate, and a plurality of first signal lines and a plurality of second signal lines insulated from each other on a side of the base substrate; wherein in the display area, the plurality of first signal lines extend along a first direction and are arranged along a second direction, the plurality of second signal lines extend along the second direction and are arranged along the first direction, and the first direction and the second direction are parallel to the base substrate and intersect with each other; and wherein when some of the plurality of first signal lines extend to the wiring region, wiring of the some of the plurality of first signal lines is configured to be around the assembly setting area and forms a first signal line concentrated region, and one of the plurality of first signal lines passing through the wiring region comprises a first signal line body portion located in the display area and a first signal line winding portion located in the wiring region; wherein when some of the plurality of second signal lines extend to the wiring region, wiring of the some of the plurality of second signal lines is configured to be around the assembly setting area and forms a second signal line concentrated region, and one of the plurality of second signal lines passing through the wiring region comprises a second signal line body portion located in the display area and a second signal line winding portion located in the wiring region; and wherein the second signal line concentrated region is located between the first signal line concentrated region and the assembly setting area, the second signal line winding portion comprises a second signal line straight line portion and a second signal line connecting portion, wherein the second signal line straight line portion extends along a same direction as the second signal line body portion, the second signal line connecting portion comprises a first winding line and a second winding line, and the first winding line and the second winding line are disposed in different layers.

2. The array substrate of claim 1, wherein the array substrate comprises a first metal layer and a second metal layer which are sequentially stacked, wherein the first metal layer is located between the second metal layer and the base substrate; wherein the first signal line body portion is disposed in the first metal layer, the second signal line body portion is disposed in the second metal layer, the plurality of first signal lines are scanning lines, and the plurality of second signal lines are data lines; or, the first signal line body portion is disposed in the second metal layer, the second signal line body portion is disposed in the first metal layer, the plurality of first signal lines are the data lines, and the plurality of second signal line are the scanning lines.

3. The array substrate of claim 2, wherein the first signal line winding portion and the first signal line body portion are disposed in a same layer, the first winding line and the second signal line body portion are disposed in a same layer, and the second winding line and the first signal line body portion are disposed in a same layer.

4. The array substrate of claim 2, wherein the array substrate further comprises a third metal layer, wherein the second metal layer is located between the first metal layer and the third metal layer; wherein the first signal line winding portion is disposed in the third metal layer; and wherein the first winding line and the second signal line body portion are disposed in a same layer, and the second winding line and the first signal line body portion are located in a same layer.

5. The array substrate of claim 2, wherein the array substrate further comprises a third metal layer, wherein the second metal layer is disposed between the first metal layer and the third metal layer; and wherein the first signal line winding portion and the first signal line body portion are disposed in a same layer, the first winding line and the second signal line body portion are disposed in a same layer, and the second winding line is disposed in the third metal layer.

6. The array substrate of claim 1, wherein a line width of the second signal line straight line portion is larger than a line width of the second signal line body portion in one of the plurality of second signal lines.

7. The array substrate of claim 1, wherein the number of second signal line winding portions is larger than the number of first signal line winding portions.

8. The array substrate of claim 7, wherein the number of the second signal line winding portions is 2-4 times the number of the first signal line winding portions.

9. The array substrate of claim 1, wherein in the second signal line concentrated region, an orthographic projection of the first winding line on the base substrate is overlapped with an orthographic projection of the second winding line on the base substrate.

10. The array substrate of claim 1, wherein the number of first winding lines is equal to the number of second winding lines.

11. The array substrate of claim 1, wherein a first sub-signal line is one of the plurality of second signal lines comprising the first winding line, and a second sub-signal line is one of the plurality of second signal lines comprising the second winding line; wherein
in the wiring region, N adjacent second signal lines constitute a signal line group, wherein second signal lines in the signal line group are all first sub-signal lines or all second sub-signal lines; and wherein two adjacent signal line groups comprise the first sub-signal lines and the second sub-signal lines, and N is a positive integer greater than one.

12. The array substrate of claim 1, wherein the array substrate further comprises a gate electrode insulating layer disposed between a plurality of first signal line body portions and a plurality of second signal line body portions, the first winding line and the second signal line body portion are disposed in a same layer, and the second winding line and the second signal line straight line portion are disposed in different layers and electrically connected through via holes disposed in the gate electrode insulating layer.

13. The array substrate of claim 1, wherein a contour of the assembly setting area is in a shape of a circle or an ellipse.

14. A display panel, comprising an array substrate, wherein the array substrate comprises a display area and at least one non-display area surrounded by the display area; wherein the at least one non-display area comprises a wiring region and an assembly setting area; wherein
the array substrate comprises a base substrate, and a plurality of first signal lines and a plurality of second signal lines insulated from each other on a side of the base substrate; wherein in the display area, the plurality of first signal lines extend along a first direction and are arranged along a second direction, the plurality of second signal lines extend along the second direction and are arranged along the first direction, and the first direction and the second direction are parallel to the base substrate and intersect with each other; and wherein
when some of the plurality of first signal lines extend to the wiring region, wiring of the some of the plurality of first signal lines is configured to be around the assembly setting area and forms a first signal line concentrated region, and one of the plurality of first signal lines passing through the wiring region comprises a first signal line body portion located in the display area and a first signal line winding portion located in the wiring region; wherein when some of the plurality of second signal lines extend to the wiring region, wiring of the some of the plurality of second signal lines is configured to be around the assembly setting area and forms a second signal line concentrated region, and one of the plurality of second signal lines passing through the wiring region comprises a second signal line body portion located in the display area and a second signal line winding portion located in the wiring region; and
wherein the second signal line concentrated region is located between the first signal line concentrated region and the assembly setting area, the second signal line winding portion comprises a second signal line straight line portion and a second signal line connecting portion, wherein the second signal line straight line portion extends along a same direction as the second signal line body portion, the second signal line connecting portion comprises a first winding line and a second winding line, and the first winding line and the second winding line are disposed in different layers.

15. A display device, comprising a display panel, wherein the display panel comprises an array substrate, wherein the array substrate comprises a display area and at least one non-display area surrounded by the display area; wherein the at least one non-display area comprises a wiring region and an assembly setting area; wherein
the array substrate comprises a base substrate, and a plurality of first signal lines and a plurality of second signal lines insulated from each other on a side of the base substrate; wherein in the display area, the plurality of first signal lines extend along a first direction and are arranged along a second direction, the plurality of second signal lines extend along the second direction and are arranged along the first direction, and the first direction and the second direction are parallel to the base substrate and intersect with each other; and wherein
when some of the plurality of first signal lines extend to the wiring region, wiring of the some of the plurality of first signal lines is configured to be around the assembly setting area and forms a first signal line concentrated region, and one of the plurality of first signal lines passing through the wiring region comprises a first signal line body portion located in the display area and a first signal line winding portion located in the wiring region; wherein when some of the plurality of second signal lines extend to the wiring region, wiring of the some of the plurality of second signal lines is configured to be around the assembly setting area and forms a second signal line concentrated region, and one of the plurality of second signal lines passing through the wiring region comprises a second signal line body portion located in the display area and a second signal line winding portion located in the wiring region; and
wherein the second signal line concentrated region is located between the first signal line concentrated region and the assembly setting area, the second signal line winding portion comprises a second signal line straight line portion and a second signal line connecting portion, wherein the second signal line straight line portion extends along a same direction as the second signal line body portion, the second signal line connecting portion comprises a first winding line and a second winding line, and the first winding line and the second winding line are disposed in different layers.

16. The display device of claim 15, wherein the display device further comprises at least one function assembly, wherein an orthographic projection of the at least one function assembly on the base substrate is located in the assembly setting area.

* * * * *